United States Patent
Hara et al.

(10) Patent No.: US 6,973,002 B2
(45) Date of Patent: Dec. 6, 2005

(54) SEMICONDUCTOR INTEGRATED CIRCUIT COMPRISING SENSE AMPLIFIER ACTIVATING CIRCUIT FOR ACTIVATING SENSE AMPLIFIER CIRCUIT

(75) Inventors: Takahiko Hara, Yokohama (JP); Masahiro Yoshihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 10/668,027

(22) Filed: Sep. 22, 2003

(65) Prior Publication Data
US 2004/0075104 A1    Apr. 22, 2004

(30) Foreign Application Priority Data

Sep. 24, 2002  (JP)  ............................. 2002-278072
Sep. 12, 2003  (JP)  ............................. 2003-320862

(51) Int. Cl.[7] ............................................... G11C 7/00
(52) U.S. Cl. ...................................... 365/205; 365/207
(58) Field of Search ............................... 365/205, 207, 365/208

(56) References Cited

U.S. PATENT DOCUMENTS 5,719,814 A    2/1998    Ishikawa 6,466,502 B1 *  10/2002  Matsumoto .................. 365/208
6,535,451 B2 *  3/2003   Sekiguchi et al. ...... 365/230.03
2001/0015930 A1 *  8/2001  Ooishi ........................ 365/205

FOREIGN PATENT DOCUMENTS

JP    09-063271    3/1997

* cited by examiner

Primary Examiner—Vu A. Le
(74) Attorney, Agent, or Firm—Hogan & Hartson LLP

(57) ABSTRACT

A semiconductor integrated circuit is composed of a memory array, sense amplifiers, a first and second drive circuits, and a sense amplifier control circuit. The memory cell array has memory cells arranged in matrix form. The sense amplifiers amplify a signal read from the memory cells. The sense amplifiers include N channel sense amplifiers each composed of an N channel MOS transistor and P channel sense amplifiers each composed of a P channel MOS transistor. The first and second drive circuits each include an N channel MOS transistor that drives the N channel sense amplifiers or the P channel sense amplifiers, respectively. The first and second drive circuits are arranged adjacent to the sense amplifiers. The sense amplifier control circuit supplies a common control signal to both gate electrodes of the N channel MOS transistors included in the first and second drive circuits.

11 Claims, 14 Drawing Sheets

SEMICONDUCTOR INTEGRATED CIRCUIT COMPRISING SENSE AMPLIFIER ACTIVATING CIRCUIT FOR ACTIVATING SENSE AMPLIFIER CIRCUIT

CROSS-REFERENCE TO RELATED APPLICATIONS

This application is based upon and claims the benefit of priority from the prior Japanese Patent Applications No. 2002-278072, filed Sep. 24, 2002; and No. 2003-320862, filed Sep. 12, 2003, the entire contents of both of which are incorporated herein by reference.

BACKGROUND OF THE INVENTION

1. Field of the Invention

The present invention relates to a semiconductor integrated circuit, and in particular, to a dynamic random access memory comprising a sense amplifier circuit that reads the potential across a bit line and a sense amplifier activating circuit for activating the sense amplifier circuit.

2. Description of the Related Art

In recent years, there has been a growing demand for randomly accessible dynamic random access memories (hereinafter referred to as "DRAMs") used as storage elements for routers or data servers for communication.

An example of a configuration of a conventional DRAM will be described below. FIG. 1 is a circuit diagram showing an example of a conventional DRAM using bit line sense amplifiers.

A buffer control circuit 101 creates a bit line sense amplifier control signal $\phi$SA, a word line control signal $\phi$WL, and a row address RA from a plurality of externally input signals EXT. The bit line sense amplifier control signal $\phi$SA is input to a sense amplifier control circuit 102. The word line control signal $\phi$WL is input to a word line drive circuit 103. The row address RA is input to a row decoder 104.

Word lines WL1, . . . , WLn−1, and WLn connected to the row decoder 104 are each connected to a memory cell MC composed of a transistor TR and a capacitor CP. A plurality of memory cells MC are arranged in array form to constitute a memory cell array 105.

Reading or writing data from or to the memory cell MC is controlled by the bit line sense amplifier. The bit line sense amplifier is composed of a dynamic CMOS sense amplifier 106, a cell array selection switch 107, a bit line equalize circuit 108, and a column section switch 109. The sense amplifier 106 is cross-connected between a pair of bit lines BL and bBL that are complementary to each other. The cell array selection switch 107 is arranged between the cell array 105 and the sense amplifier 106. The bit line equalize circuit 108 connects the pair of bit lines BL and bBL together and precharges the pair of bit lines BL and bBL to a voltage Vb1. The column selection switch 109 is controlled by a column selection signal CSL to select one of the pair of bit lines BL and bBL from or to which data are read or written.

The dynamic CMOS sense amplifier 106 has an N channel sense amplifier composed of an N channel MOS transistors T101 and T102 and a P channel sense amplifier composed of a P channel MOS transistors T103 and T104. An N channel sense amplifier drive signal SAN is input to a common source of the N channel sense amplifier. A P channel sense amplifier drive signal SAP is input to a common source of the P channel sense amplifier. Both sense amplifier drive signals SAN and SAP are output by the sense amplifier control circuit 102.

FIG. 2 shows the configuration of the sense amplifier control circuit 102. A timing generating circuit 110 creates various control signals SEN, SEP, and SAEQ required for the sense amplifier control circuit on the basis of the sense amplifier control signal $\phi$SA.

In a sense amplifier drive circuit 111, an N channel sense enable signal SEN is input to a gate of an N channel MOS transistor T111, and a ground potential Vss is supplied to a source thereof. A drain of this transistor T111 outputs the signal SAN.

Further, a P channel sense enable signal SEP is input to a gate of a P channel MOS transistor T112, and a bit line restore potential Vaa is supplied to a source thereof. A drain of this transistor T112 outputs the signal SAP.

A sense amplifier equalize circuit 112 is composed of transistors T113, T114, and T115 and controlled by a sense amplifier equalize signal SAEQ. The sense amplifier equalize circuit 112 connects the drain of the transistor T111 and the drain of the transistor T112 together according to the equalize signal SAEQ, and precharges the signals SAN and SAP to an equalize potential VBL.

Now, description will be given of a basic operation performed by the bit line sense amplifier to sense a bit line potential. FIG. 3 is a timing chart showing a sense operation performed by the bit line sense amplifier.

First, a bit line equalize signal BLEQ falls to inactivate the bit line equalize circuit 108. Subsequently, when the word line WLn rises, charges stored in the memory cell capacitor CP are read out to the bit line bBL via the transistor TR. If the stored data is "0", the potential across the bit line bBL becomes about 100 mV lower than the equalize potential VBL.

Subsequently, the sense enable signals SEN and SEP are activated in this order to change the sense amplifier drive signal SAN to the ground potential Vss and the sense amplifier drive signal SAP to the voltage Vaa. If the decrease in the voltage of the signal SAN increases a gate-source voltage Vgs of the transistor T102 above a threshold Vthn of the transistor T102, the transistor T102 is turned on. If the increase in the voltage of the signal SAP increases a gate-source voltage Vgs of the transistor T103 above a threshold Vthp of the transistor T103, the transistor T103 is turned on. Thus, the bit line bBL discharges so that its voltage reaches the ground potential Vss, while the bit line BL is charged so that its potential reaches the voltage Vaa. As a result, the signal read out to the bit line bBL is amplified.

Subsequently, once a sufficient potential difference occurs between the pair of bit lines BL and bBL, the column selection signal CSL, input to the column selection switch 109, rises to cause data to be read out to a pair of I/O lines IO and bIO. Even after the data has been read out to the pair of I/O lines, charging and discharging of the pair of bit lines BL and bBL, respectively, are continued to restore the data in the memory cell.

The above operation indicates that it is important to increase the speed of the operation of sensing the bit line potential and in particular, to reduce initial sense time, in order to either read data from the memory cell at high speed or reduce cycle time including restoration of data in the memory cell.

To reduce the above initial sense time, it is particularly effective to increase the values of currents flowing to the ground potential Vss and the voltage Vaa via interconnections through which the signals SAN and SAP flow, i.e.

reduce the resistance of the interconnections through which the signals SAN and SAP flow and to increase the sizes of the transistors T111 and T112, which drive the signals SAN and SAP. Thus, efforts have been made to improve the layout of sense amplifiers and sense amplifier drive circuits. An example will be shown below.

FIG. 4 is a schematic diagram showing a layout of sense amplifiers and sense amplifier drive circuits. FIG. 4 shows an example in which the sense amplifier drive circuit (SAD) 111 is distributively arranged to reduce the resistance of interconnections through which the sense amplifier drive signals SAN and SAP flow from the sense amplifier drive circuit (SAD) 111 to the sense amplifiers (SA1 to SA2m) 106.

If two memory cell arrays share the sense amplifiers, a 2 m column of sense amplifiers 106 are arranged to each of the right and left of a 4 m column of a cell array 105. Here, the 2 m column of sense amplifiers arranged to the right of the cell array are not shown. The sense amplifier drive circuit 111 is arranged in the center of the column of sense amplifiers (SA1 to SA2m). With this method, such a layout is provided that the pitch of one column of sense amplifiers is smaller than the pitch of two columns of the cell array 105 so that a sufficient space in which the sense amplifier drive circuit 111 is arranged is created within the column of sense amplifiers 106 without the need to increase the size of the sense amplifiers.

However, the layout method shown in FIG. 4 does not allow a transistor of the sense amplifier drive circuit 111 to be set to have sufficiently large dimensions. Furthermore, the connections of the bit lines between the cell array 105 and the sense amplifiers 106 are complicated as shown in an area W1, thereby unbalancing the interconnection capacities of the bit lines. Consequently, this layout method is inappropriate if the speed of the sense operation is critical.

BRIEF SUMMARY OF THE INVENTION

According to an aspect of the invention, there is provided a semiconductor integrated circuit comprising a memory cell array having memory cells arranged in matrix form; sense amplifiers which amplify a signal read out from the memory cells and which include N channel sense amplifiers each comprising an N channel MOS transistor and P channel sense amplifiers each comprising a P channel MOS transistor; a first and second drive circuits each including an N channel MOS transistor which drives the N channel sense amplifiers or P channel sense amplifiers, respectively, included in the sense amplifiers, the first and second drive circuits being arranged adjacent to the sense amplifiers; and a sense amplifier control circuit which supplies a common control signal to both gate electrodes of the N channel MOS transistors included in the first and second drive circuits.

DETAILED DESCRIPTION OF THE INVENTION

Before describing an embodiment of the present invention, description will be given of a semiconductor integrated circuit in which sense amplifiers are arranged adjacent to sense amplifier drive circuits to drive the sense amplifiers. In this case, a randomly accessible dynamic random access memory (DRAM) will be described as a semiconductor integrated circuit.

Figure 1:
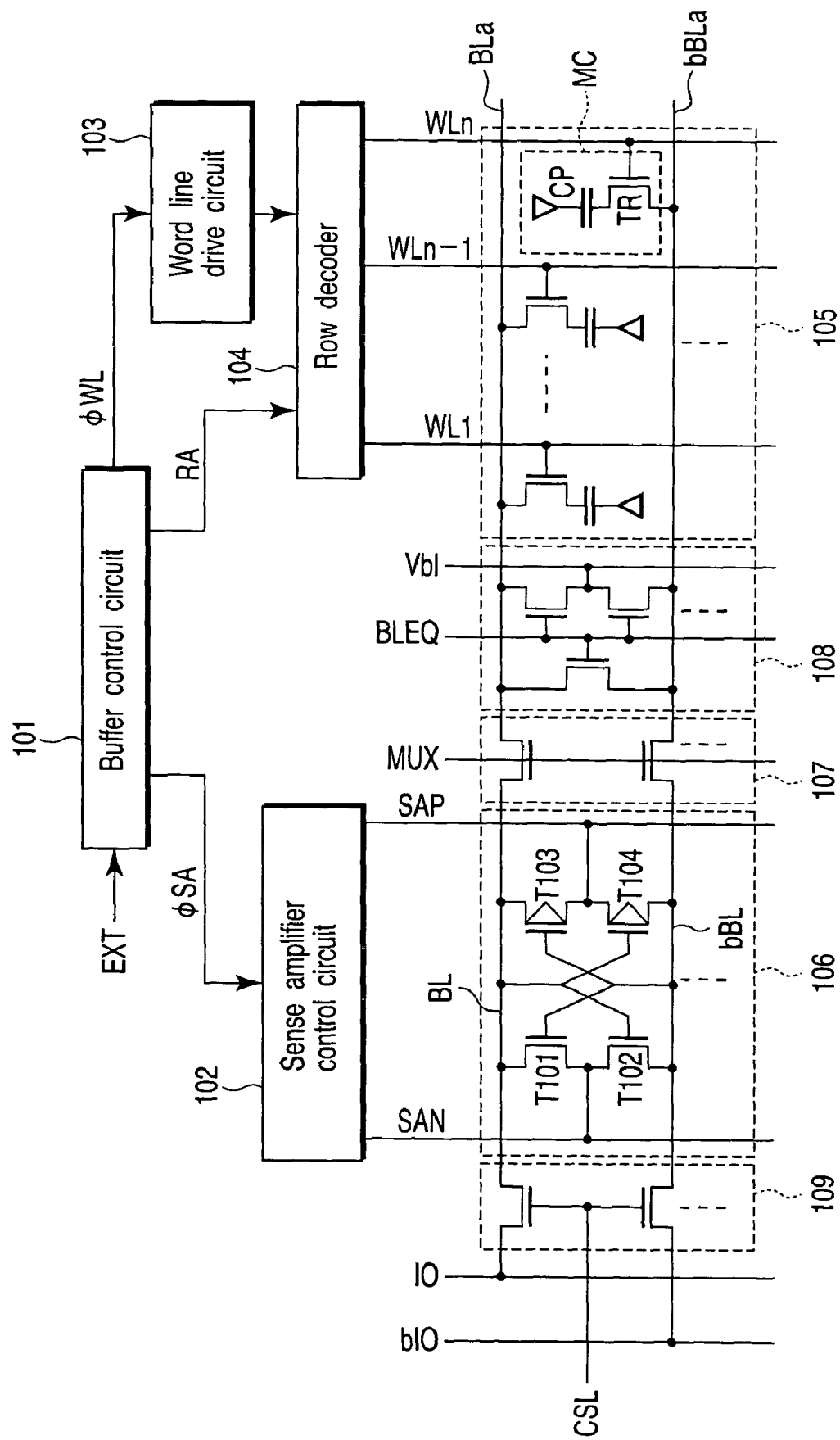
FIG. 1 is a circuit diagram showing an example of a conventional DRAM using bit line sense amplifiers.
Figure 2:
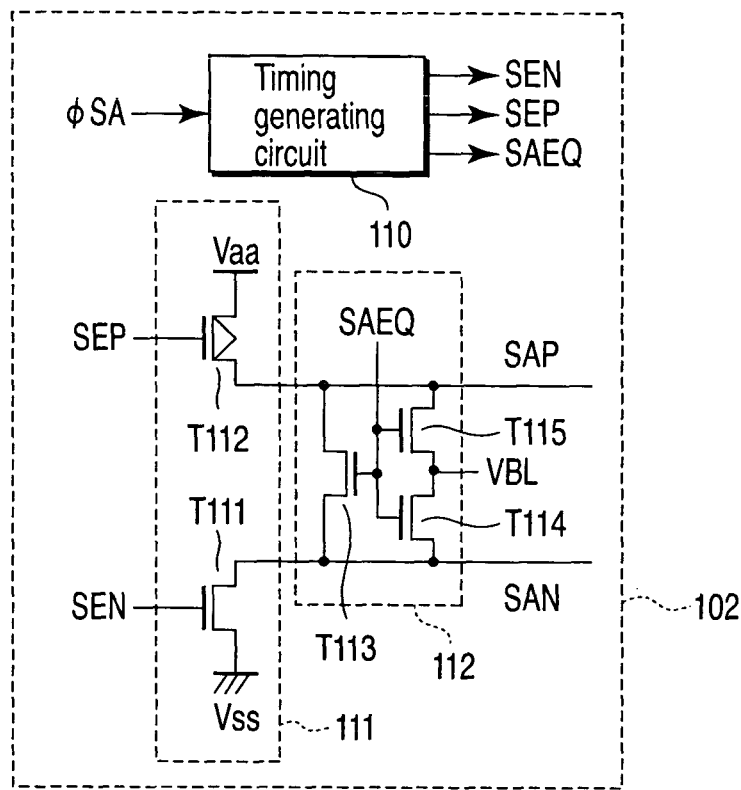
FIG. 2 is a circuit diagram showing the configuration of a sense amplifier control circuit in the DRAM.
Figure 3:
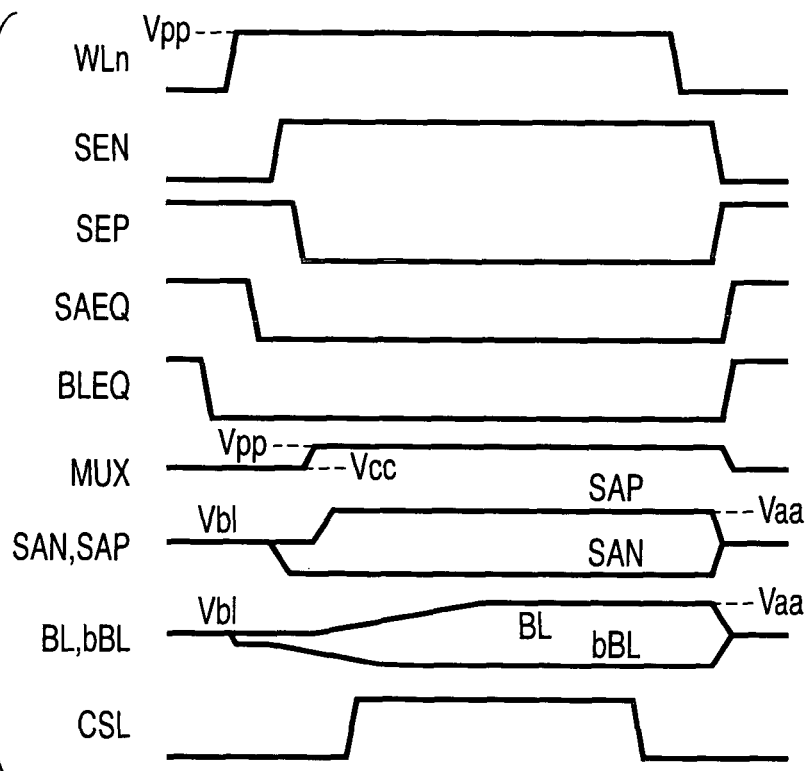
FIG. 3 is a timing chart showing a sense operation performed by the bit line sense amplifier in the DRAM.
Figure 4:
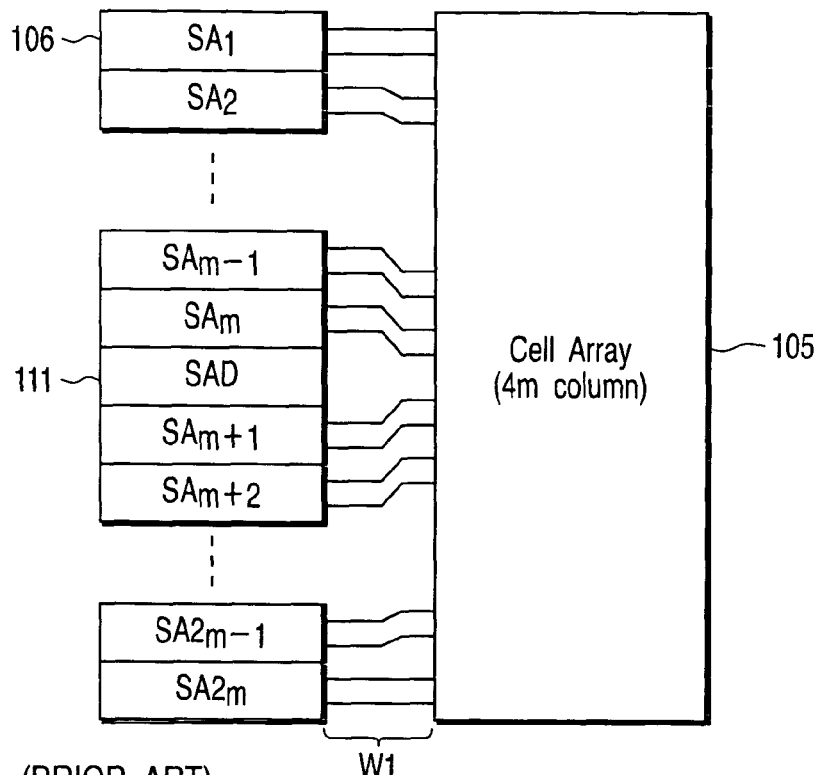
FIG. 4 is a schematic diagram showing a layout of sense amplifiers and sense amplifier drive circuits in the DRAM.
Figure 5:
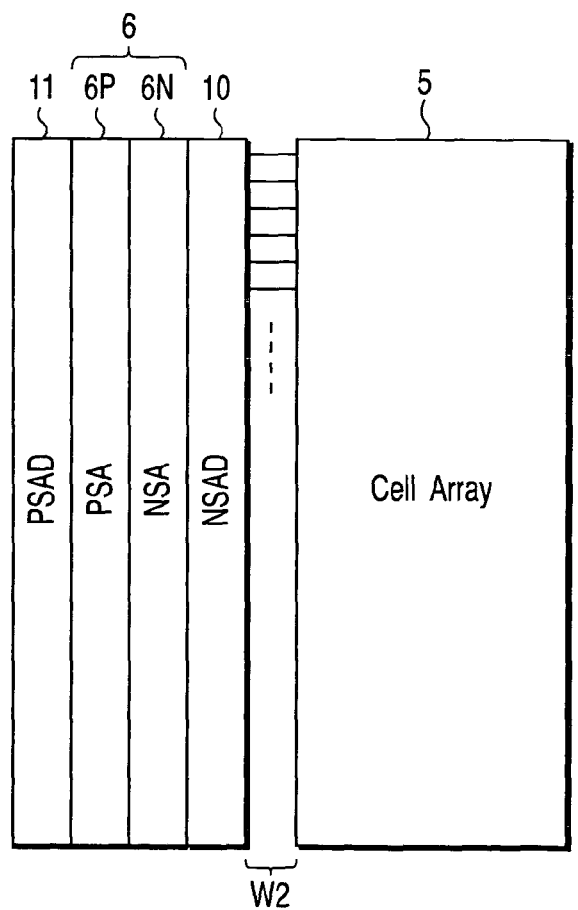
FIG. 5 is a schematic diagram showing a layout of sense amplifiers and sense amplifier drive circuits all used in a semiconductor integrated circuit.

FIG. 5 is a schematic diagram showing a layout of sense amplifiers and sense amplifier drive circuits all commonly used if the speed of sense operations performed by the sense amplifiers is critical.

In FIG. 5, the pitch of one column of sense amplifiers 6 is set to be equal to the pitch of two columns of cell arrays 5. A sense amplifier drive circuit (PSAD) 11 to drive P channel sense amplifiers is arranged adjacent to a P channel sense amplifier column 6P having the P channel sense amplifiers (PSA) arranged therein. Further, a sense amplifier drive circuit (NSAD) 10 to drive N channel sense amplifiers is arranged adjacent to an N channel sense amplifier column 6N having the N channel sense amplifiers (NSA) arranged therein.

Figure 6:
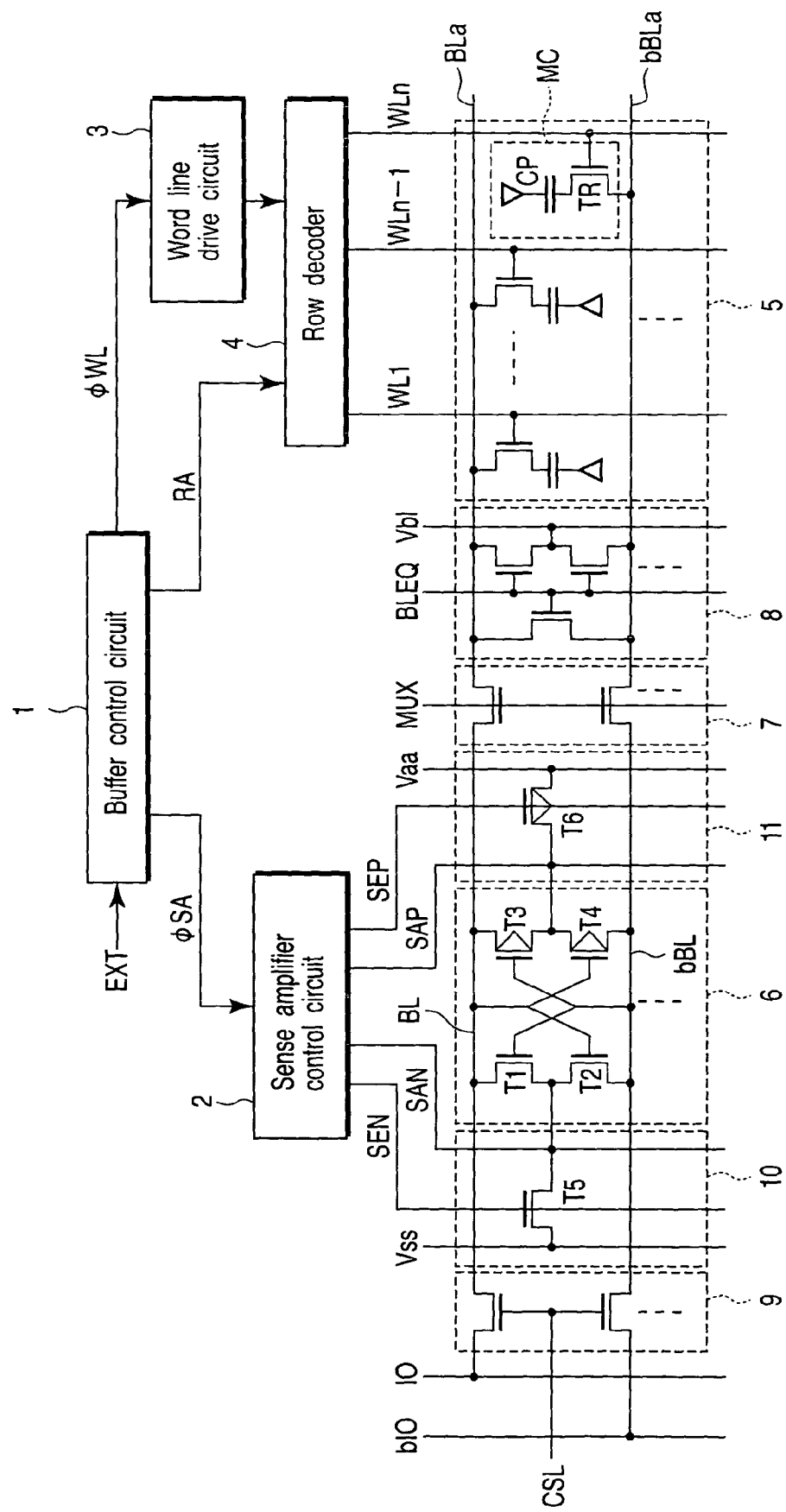
FIG. 6 is a circuit diagram showing the configuration of the semiconductor integrated circuit laid out as shown in FIG. 5.

FIG. 6 is a circuit diagram showing the configuration of the semiconductor integrated circuit laid out as shown in FIG. 5.

As shown in FIG. 6, a plurality of external input signals EXT are input to a buffer control circuit 1. The buffer control circuit 1 creates a bit line sense amplifier control signal φSA, a word line control signal φWL, and a row address RA on the basis of the external input signals EXT. The bit line sense amplifier control signal φSA is input to a sense amplifier control circuit 2. The word line control signal φWL is input to a word line drive circuit 3. The row address RA is input to a row decoder 4.

Word lines WL1, ..., WLn−1, and WLn to which output signals from the row decoder 4 are each connected to a memory cell MC composed of a transistor TR and a capacity CP. A plurality of memory cells MC are arranged in array form to constitute a memory cell array 5.

Reading or writing data from or to the memory cell MC is controlled by the bit line sense amplifier. The bit line sense amplifier is composed of a dynamic CMOS sense amplifier 6, a cell array selection switch 7, a bit line equalize circuit 8, a column section switch 9, and sense amplifier drive circuits 10 and 11. The sense amplifier 6 is cross-connected between a pair of bit lines BL and bBL that are complementary to each other. The cell array selection switch 7 is arranged between the cell array 5 and the sense amplifier 6. The bit line equalize circuit 8 connects the pair of bit lines BL and bBL together and precharges the pair of bit lines BL and bBL to a voltage Vb1. The column selection switch 9 is controlled by a column selection signal CSL to select one of the pair of bit lines BL and bBL from or to which data are read or written. The sense amplifier drive circuits 10 and 11 activate or inactivate the sense amplifier 6.

Typically, the sense amplifier 6 is shared by two cell arrays. Accordingly, another cell array selection switch 7 and another bit line equalize circuit 8 are connected to this circuit on the other side of the sense amplifier 6 from the above cell array selection switch and bit line equalize circuit. However, they are not shown herein.

The dynamic CMOS sense amplifier 6 has an N channel sense amplifier composed of an N channel MOS transistors T1 and T2 and a P channel sense amplifier composed of a P channel MOS transistors T3 and T4.

An N channel sense amplifier drive signal SAN is input to a common source of the N channel sense amplifier. Furthermore, the sense amplifier drive signal SAN is input to a drain of an N channel MOS transistor T5 constituting the N channel sense amplifier drive circuit 10. A source of the transistor T5 is supplied with a ground potential Vss, while a sense enable signal SEN is input to a gate thereof.

Further, a P channel sense amplifier drive signal SAP is input to a common source of the P channel sense amplifier. Furthermore, the sense amplifier drive signal SAP is input to a drain of a P channel MOS transistor T6 constituting the P channel sense amplifier drive circuit 11. A source of the transistor T6 is supplied with a bit line restore potential Vaa, while a sense enable signal SEP is input to a gate thereof. The sense amplifier control circuit 2 outputs all of the sense amplifier drive signals SAN and SAP and the sense enable signals SEN and SEP.

Figure 7:
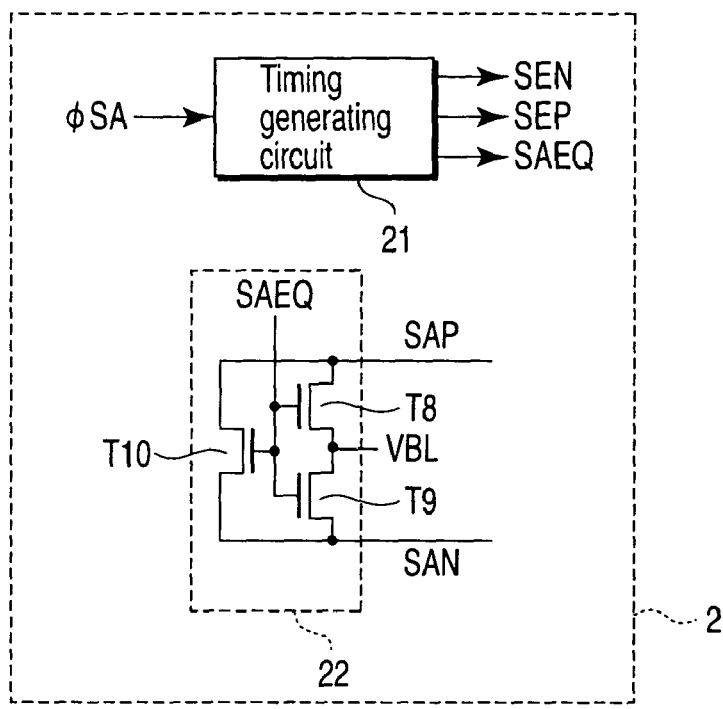
FIG. 7 is a circuit diagram showing the configuration of a sense amplifier control circuit in the semiconductor integrate circuit.

FIG. 7 shows the configuration of the sense amplifier control circuit 2.

The sense amplifier control circuit 2 has a timing generating circuit 21 and an equalize circuit 22. A timing generating circuit 21 creates various control signals SEN, SEP, and SAEQ required for a sense amplifier operation on the basis of the input sense amplifier control signal φSA. The equalize circuit 22 is composed of transistors T8, T9, and T10 to receive the control signal SAEQ to equalize the sense amplifier drive signals SAN and SAP. When the sense amplifier 6 is inactive, the equalize circuit 22 precharges the sense amplifier drive signals SAN and SAP to an equalize potential Vb1 (Vaa/2 level) according to the sense amplifier equalize signal SAEQ.

Figure 8:
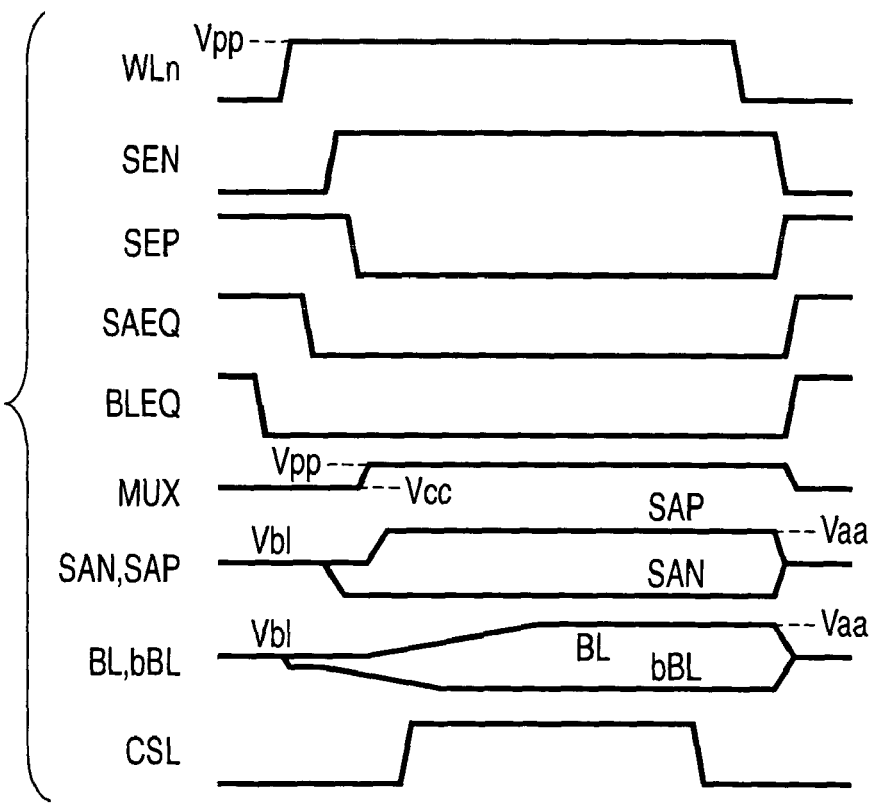
FIG. 8 is a timing chart showing an operation performed by the bit line sense amplifier in the semiconductor integrated circuit to sense a bit line potential.

Now, description will be given of a basic operation of sensing a bit line potential. FIG. 8 is a timing chart showing an operation performed by the bit line sense amplifier to sense the bit line potential.

First, a bit line equalize signal BLEQ rises to inactivate the bit line equalize circuit 8. Then, when the word line WLn rises, charges stored in the memory cell capacity CP are read out to the bit line bBL via the transistor TR. If the stored data is "0", the potential across the bit line bBL becomes about 100 mV lower than the equalize potential Vb1.

Subsequently, the sense enable signal SEN rises to a voltage Vpp, and then the sense enable SEP rises to the ground potential Vss. Thus, the sense amplifier drive circuit (transistors T5 and T6) is activated. The activation of the transistors T5 and T6 changes the sense amplifier drive signal SAN to the ground potential Vss and the sense amplifier drive signal SAP to the voltage Vaa.

If the decrease in the voltage of the signal SAN increases a gate-source voltage Vgs of the transistor T2 above a threshold Vthn of the transistor T2, the transistor T2 is turned on. If the increase in the voltage of the signal SAP increases a gate-source voltage Vgs of the transistor T3 above a threshold Vthp of the transistor T3, the transistor T3 is turned on. Thus, the bit line bBL discharges so that its voltage reaches the ground potential Vss, while the bit line BL is charged so that its potential reaches the voltage Vaa. As a result, the signal read out to the bit line bBL is amplified.

Subsequently, once a sufficient potential difference occurs between the pair of bit lines BL and bBL, the column selection signal CSL, input to the column selection switch 9, rises to cause data to be read out to a pair of I/O lines IO and bIO. Even after the data has been read out to the pair of I/O lines, charging and discharging of the pair of bit lines BL and bBL, respectively, are continued to restore the data in the memory cell.

Figure 9:
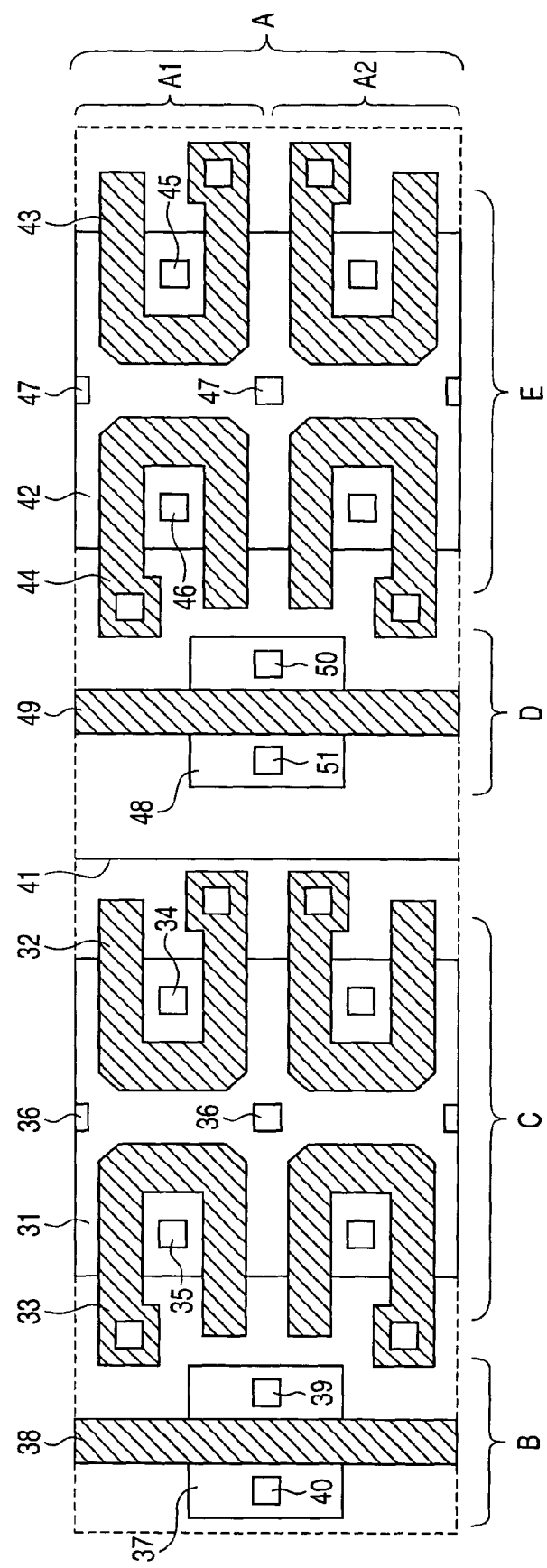
FIG. 9 is a diagram showing a layout of transistors constituting sense amplifiers and sense amplifier drive circuits in the semiconductor integrated circuit.

FIG. 9 shows a specific layout of transistors constituting the sense amplifiers and sense amplifier drive circuits.

FIG. 9 shows two columns of sense amplifiers and two columns of sense amplifier drive circuits. P channel sense amplifiers (transistors T3 and T4) are arranged in an area C. A P channel sense amplifier drive circuit (transistor T6) is arranged in an area B. Further, N channel sense amplifiers (transistors T1 and T2) are arranged in an area E. An N channel sense amplifier drive circuit (transistor T5) is arranged in an area D. Areas A1 and A2 show sense amplifier areas for each column.

As shown in FIG. 9, a P type diffusion area 31 has gate electrodes 32 and 33, drain contacts 34 and 35, and a common source contact 36 formed thereon. The gate electrodes 32 and 33 belong to the cross-coupled P channel transistors T3 and T4. The drain contacts 34 and 35 are connected to a drain of each of the transistors T3 and T4. The common source contact 36 is connected to a common source of the transistors T3 and T4.

A drive transistor T6 constituting a sense amplifier drive circuit is arranged adjacent to the P channel sense amplifiers, composed of the transistors T3 and T4. The drive transistor T6 is formed in a P type diffusion area 37. The P type diffusion area 37 has a gate electrode 38, drain contact 39, and source contact 40 of the transistor T6 formed thereon. Although not shown, a gate contact of the gate electrode 38 is taken from interconnections extending in a vertical direction on the sense amplifier areas for every certain sense amplifier unit.

A well boundary 41 exists between an N type well area including P channel sense amplifiers and a P type well area including N channel sense amplifiers. As previously described, areas E and D in the P type well area have the N channel sense amplifiers (transistors T1 and T2) and the sense amplifier drive circuit (transistor T5), respectively, arranged therein.

In the layout shown in FIG. 9, one drive transistor is arranged adjacent to every two columns of sense amplifiers, thereby minimizing the resistance of the interconnections between the sense amplifiers and the drive transistor, which drives the sense amplifiers. Further, the dimensions of each drive transistor provided for every two columns of sense amplifier can be set at sufficiently large values, thereby reducing the time required to sense the bit line potential.

However, the layout shown in FIG. 9 requires larger areas in which the sense amplifiers and the sense amplifier drive circuits are formed, thereby increasing chip size. Specifically, the drive transistors for the N and P channel sense amplifiers are arranged at the respective sides of these sense amplifiers, thereby increasing the transistor areas. Furthermore, two additional interconnections are required for the sense enable signals SEN and SEP, which drive the sense amplifiers. This significantly increases chip area to prevent provision of an inexpensive DRAM that can be randomly accessed at high speed.

Description will be given below of a semiconductor integrated circuit according to an embodiment of the present invention which serves to solve the above problems. In the description, components similar to those of the previously described semiconductor integrated circuit are denoted by the same reference numerals.

Figure 10:
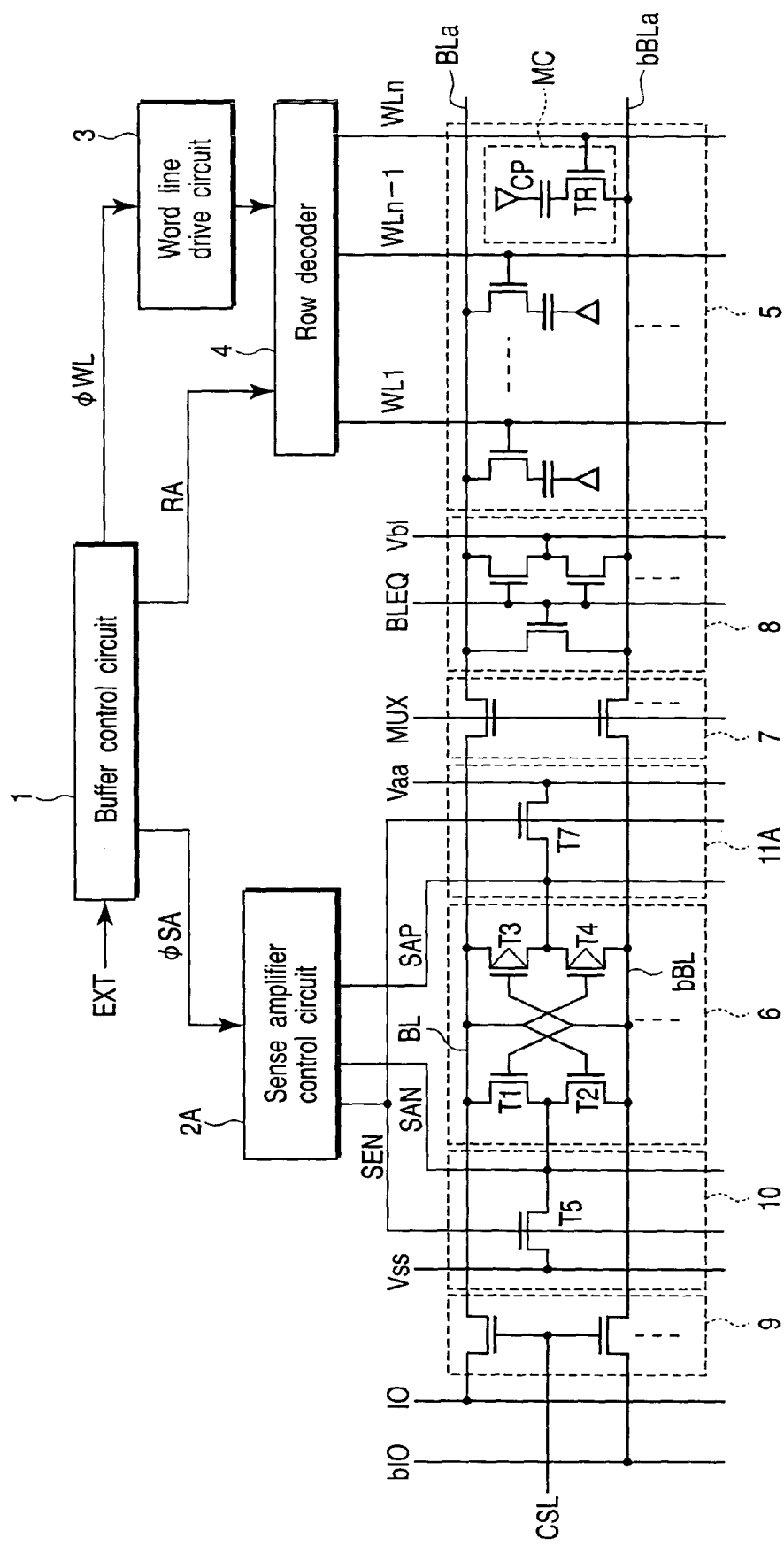
FIG. 10 is a circuit diagram showing the configuration of a semiconductor integrated circuit according to an embodiment of the present invention.

FIG. 10 is a circuit diagram showing the configuration of the semiconductor integrated circuit according to the embodiment of the present invention.

As shown in FIG. 10, the plurality of external input signals EXT are input to a buffer control circuit 1. The buffer control circuit 1 creates the bit line sense amplifier control signal φSA, the word line control signal φWL, and the row address RA on the basis of the external input signals EXT. The bit line sense amplifier control signal φSA is input to a sense amplifier control circuit 2A. The word line control signal φWL is input to a word line drive circuit 3. The row address RA is input to a row decoder 4.

The word lines WL1, . . . , WL-1, and WLn to which output signals from the row decoder 4 are each connected to the memory cell MC composed of the transistor TR and the capacity CP. A plurality of memory cells MC are arranged in array form (e.g. matrix form) to constitute the memory cell array S.

Reading or writing data from or to the memory cell MC is controlled by the bit line sense amplifier. The bit line sense amplifier is composed of the dynamic CMOS sense amplifier 6, the cell array selection switch 7, the bit line equalize circuit 8, the column section switch 9, and the sense amplifier drive circuit 10 and a sense amplifier drive circuit 11A. The sense amplifier 6 is cross-connected between the pair of bit lines BL and bBL that are complementary to each other. The cell array selection switch 7 is arranged between the cell array 5 and the sense amplifier 6. The bit line equalize circuit 8 connects the pair of bit lines BL and bBL together and precharges the pair of bit lines BL and bBL to the voltage Vb1. The column selection switch 9 is controlled by a column selection signal CSL to select one of the pair of bit lines BL and bBL from or to which data are read or written.

The sense amplifier drive circuits 10 and 11A activate or inactivate the sense amplifier 6.

Typically, the sense amplifier 6 is shared by two cell arrays. Accordingly, another cell array selection switch 7 and another bit line equalize circuit 8 are connected to this circuit on the other side of the sense amplifier 6 from the above cell array selection switch and bit line equalize circuit. However, they are not shown herein.

The dynamic CMOS sense amplifier 6 has the N channel sense amplifier composed of the N channel MOS transistors T1 and T2 and the P channel sense amplifier composed of the P channel MOS transistors T3 and T4.

The N channel sense amplifier drive signal SAN is input to the common source of the N channel sense amplifier. Furthermore, the sense amplifier drive signal SAN is input to the drain of the N channel MOS transistor T5 constituting the N channel sense amplifier drive circuit 10. The source of the transistor T5 is supplied with the ground potential Vss, while the sense enable signal SEN is input to the gate thereof.

Further, the P channel sense amplifier drive signal SAP is input to the common source of the P channel sense amplifier. Furthermore, the sense amplifier drive signal SAP is input to the drain of the P channel MOS transistor T6 constituting the P channel sense amplifier drive circuit 11. The source of the transistor T6 is supplied with the bit line restore potential Vaa, while the sense enable signal SEP is input to a gate thereof. The sense amplifier control circuit 2A outputs all of the sense amplifier drive signals SAN and SAP and the sense enable signals SEN and SEP.

This semiconductor integrated circuit differs from the one shown in FIG. 5 in that the sense amplifier drive circuit driving the P channel sense amplifier is composed of an N channel MOS transistor T7 and in that the sense amplifier drive circuits driving the N and P channel sense amplifiers, i.e. the transistors T5 and T7 have the same sense enable signal SEN input to the gates thereof.

Figure 11:
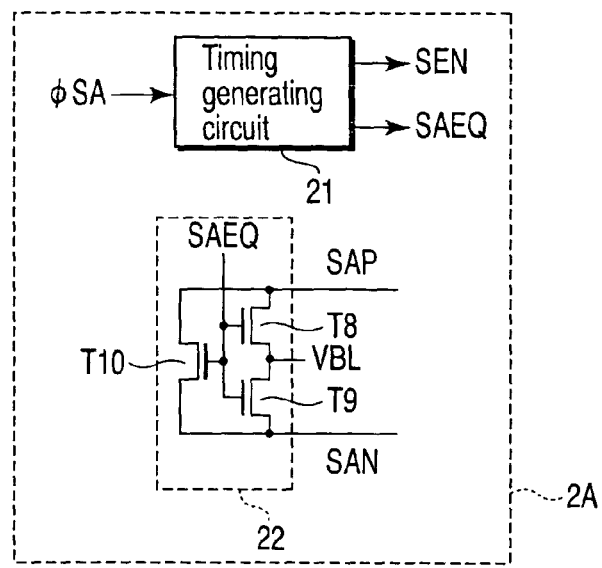
FIG. 11 is a circuit diagram showing the configuration of a sense amplifier control circuit in the semiconductor integrated circuit according to the above embodiment.

FIG. 11 shows the configuration of the sense amplifier control circuit 2A.

The sense amplifier control circuit 2A has the timing generating circuit 21 and the equalize circuit 22. The timing generating circuit 21 creates the various control signals SEN and SAEQ required for a sense amplifier operation on the basis of the input sense amplifier control signal φSA. The equalize circuit 22 is composed of the transistors T8, T9, and T10 to receive the control signal SAEQ to equalize the sense amplifier drive signals SAN and SAP. When the sense amplifier 6 is inactive, the equalize circuit 22 precharges the sense amplifier drive signals SAN and SAP to the equalize potential Vb1 (Vaa/2 level) according to the sense amplifier equalize signal SAEQ.

Figure 12:
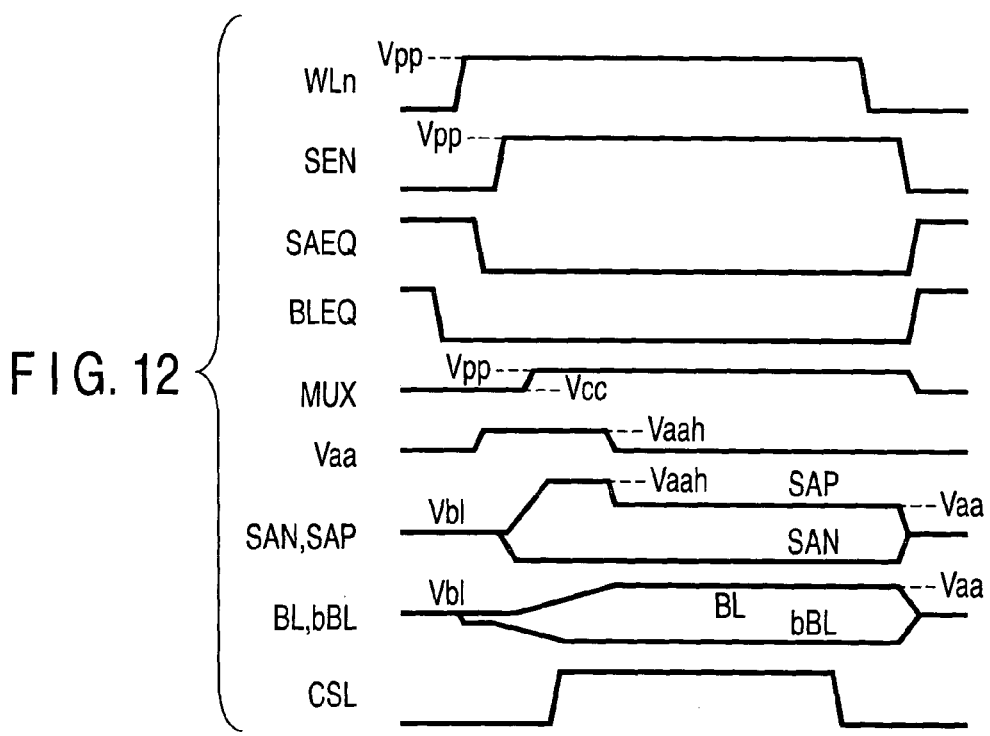
FIG. 12 is a timing chart showing an operation performed by a bit line sense amplifier in the semiconductor integrated circuit according to the above embodiment to sense a bit line potential.

Now, description will be given of a basic operation of sensing a bit line potential. FIG. 12 is a timing chart showing an operation performed by the bit line sense amplifier to sense the bit line potential.

First, the bit line equalize signal BLEQ rises to inactivate the bit line equalize circuit 8. Then, when the word line WLn rises, charges stored in the memory cell capacity CP are read out to the bit line bBL via the transistor TR. If the stored data is "0", the potential across the bit line bBL becomes about 100 mV lower than the equalize potential Vb1.

Subsequently, the sense enable signal SEN rises to the voltage Vpp to activate the sense amplifier drive circuits (transistors T5 and T7). Thus, the sense amplifier drive signal SAN changes to the ground potential Vss. At the same time, the sense amplifier drive signal SAP changes to the voltage Vaa.

In this embodiment, to further increase bit line restore speed, i.e. to increase the speed at which the bit line BL is charged up to the voltage Vaa, an overdrive method is employed in which during an initial period of an operation of sensing the bit line potential, the bit line restore potential Vaa is temporarily increased up to a voltage Vaah. The voltage Vaah is higher than the voltage Vaa by a predetermined value.

As previously described, the sense enable signal SEN is input to both gates of the drive transistors T5 and T7, which drive the N and P channel sense amplifiers, respectively. In this case, an initial value of a source potential of the transistor T7 is high and equal to the equalize potential Vb1. Thus, the rise of the P channel sense amplifier drive signal SAP is slightly later than the fall of the N channel sense amplifier drive signal SAN.

If the decrease in the voltage of the signal SAN increases the gate-source voltage Vgs of the transistor T2 above the threshold Vthn, the transistor T2 is turned on. Further, if the increase in the voltage of the signal SAP increases the gate-source voltage Vgs of the transistor T3 above the threshold Vthp, the transistor T103 is turned on. Thus, the bit line bBL discharges so that its voltage reaches the ground potential Vss, while the bit line BL is charged so that its potential reaches the voltage Vaa. As a result, the signal read out to the bit line bBL is amplified.

Subsequently, once a sufficient potential difference occurs between the pair of bit lines BL and bBL, the column selection signal CSL, input to the column selection switch 9, rises to cause data to be read out to the pair of I/O lines IO and bIO. Even after the data has been read out to the pair of I/O lines, charging and discharging of the pair of bit lines BL and bBL, respectively, are continued to restore the data in the memory cell. This overdrive is stopped when the bit line sufficiently approaches the preset voltage Vaa for restoration.

Figure 13:
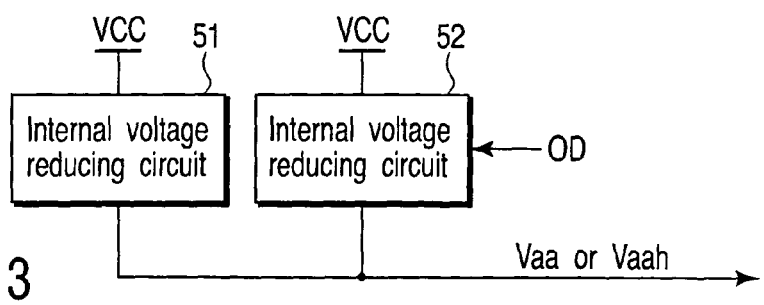
FIG. 13 is a diagram showing the configuration of an overdrive circuit in the semiconductor integrated circuit according to the above embodiment.

FIG. 13 shows the configuration of an overdrive circuit that generates the bit line restore voltage Vaa and the voltage Vaah.

This overdrive circuit is provided in a chip and has a first internal voltage reducing circuit 51 and a second internal voltage reducing circuit 52. The first internal voltage reducing circuit 51 reduces the supplied power voltage Vcc to steadily generate the preset restore voltage Vaa. Further, the second internal voltage reducing circuit 52 reduces the supplied power voltage Vcc to generate an overdrive potential. The second internal voltage reducing circuit 52 has a control signal OD input thereto to perform a switching operation according to the control signal OD to determine whether or not to output the overdrive voltage. The voltage Vaah, which is higher than the potential Vaa by the predetermined value, is generated by adding the overdrive potential to the bit line restore potential Vaa. Thus, the control signal OD input to the second internal voltage reducing circuit 52 provides such control as determines whether or not to output the voltage Vaa.

Figure 14:
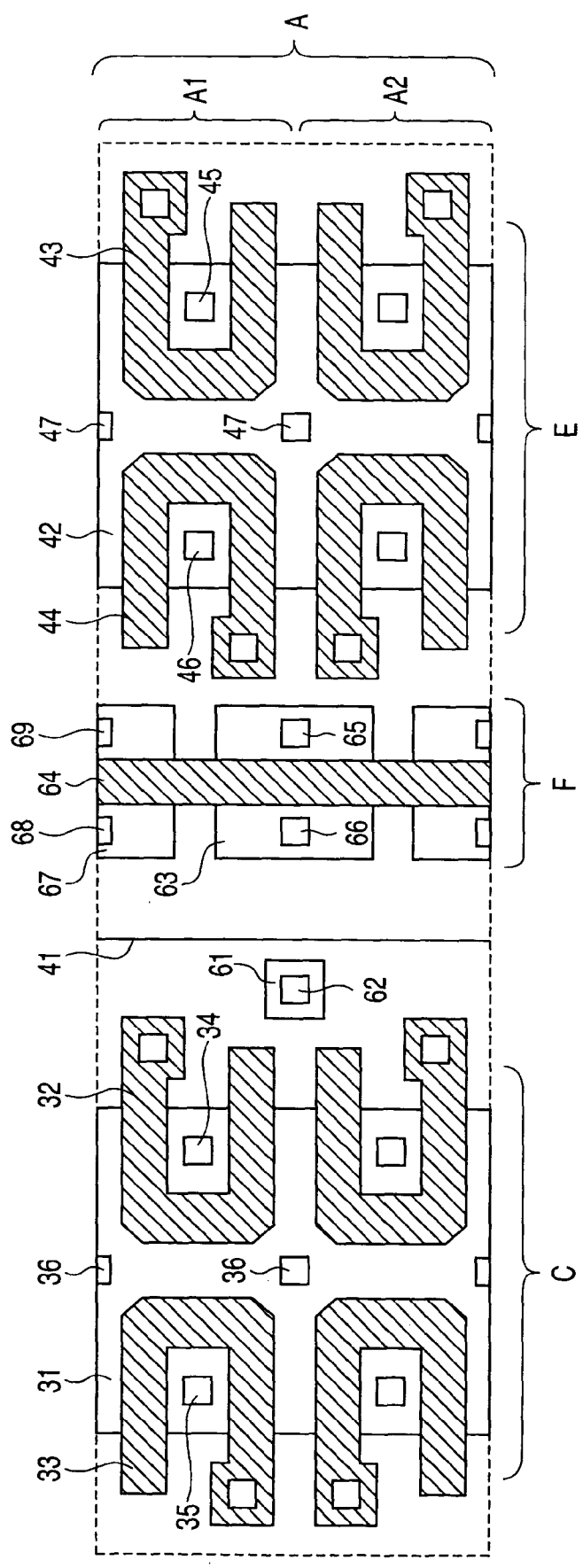
FIG. 14 is a diagram showing a layout of a first example of transistors constituting sense amplifiers and sense amplifier drive circuits in the semiconductor integrated circuit according to the above embodiment.

FIG. 14 shows a layout of a first example of transistors constituting the sense amplifiers and sense amplifier drive circuits.

FIG. 14 shows two columns of sense amplifiers and two columns of sense amplifier drive circuits. The P channel sense amplifiers (transistors T3 and T4) are arranged in the area C. The N channel sense amplifiers (transistors T1 and T2) are arranged in the area E. In an area F are arranged the sense amplifier drive circuit (transistor T5) driving the N channel sense amplifiers and the sense amplifier drive circuit (transistor T7) driving the P channel sense amplifiers. The areas Al and A2 show sense amplifier areas for each column.

The individual arrangements in the layout will be described below in detail. The P type diffusion area 31 has the gate electrodes 32 and 33, the drain contacts 34 and 35, and the common source contact 36 formed thereon. The gate electrodes 32 and 33 belong to the cross-coupled P channel transistors T3 and T4. The drain contacts 34 and 35 are connected to the drain of each of the transistors T3 and T4. The common source contact 36 is connected to the common source of the transistors T3 and T4. An N type diffusion area 61 and a contact 62 are used to provide a potential for an N type well area including P channel sense amplifiers.

The well boundary 41 exists between the N type well area including P channel sense amplifiers and the P type well area including N channel sense amplifiers.

An N type diffusion area in the P type diffusion area has gate electrodes 43 and 44, drain contacts 45 and 46, and a common source contact 47 formed thereon. The gate electrodes 43 and 44 belong to the cross-coupled N channel transistors T1 and T2. The drain contacts 45 and 46 are connected to the drain of each of the transistors T1 and T2. The common source contact 47 is connected to the common source of the transistors T1 and T2.

Further, the N channel MOS transistors T5 and T7 are formed in the area F so as to constitute a sense amplifier drive circuit. In this case, as shown in the circuit diagram of FIG. 10, both N and P sense amplifiers are driven by an N channel MOS transistor. Furthermore, the sense enable signal SEN is input to both gates of the transistors T5 and T7. In such a circuit configuration, the transistors T5 and T7 are arranged in line in the area F, located adjacent to the areas C and E, in which the sense amplifiers 6 are formed.

An N type diffusion area 63 has the N channel transistor T7 formed thereon to drive P channel sense amplifiers, and has a gate electrode 64, a source contact 65, and a drain contact 66. The source contact 65 is connected to the source of the transistor T7 and is supplied with the potential Vaa. The drain contact 66 is connected to the drain of the transistor T7 and is supplied with the sense amplifier drive signal SAP.

An N type diffusion area 67 has the N channel transistor T5 formed thereon to drive N channel sense amplifiers, and has the gate electrode 64, a source contact 68, and a drain contact 69. The illustrated transistor T5 is shown to be separated into an upper part and a lower part because of the boundary portions of the layout. The source contact 68 is connected to the source of the transistor T5 and is supplied with the potential Vaa. The drain contact 69 is connected to the drain of the transistor T5 and is supplied with the signal SAN. For the transistors T5 and T7, it is difficult to provide a sufficient boundary for channel ion injection and a sufficient space between the diffusion areas. Thus, a threshold voltage for the transistors T5 and T7 is normally set at a low equal value. Further, the transistors T5 and T7 are set to have an equal gate length.

Figure 15:
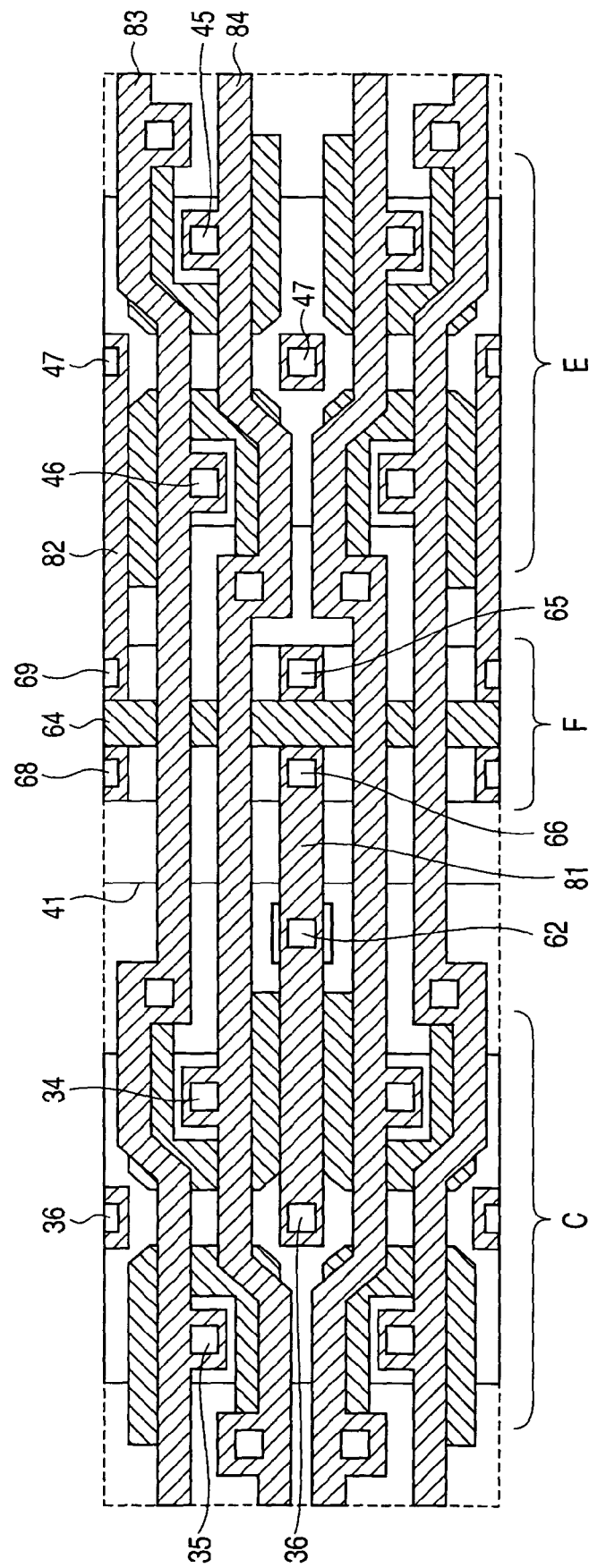
FIG. 15 is a diagram showing the layout shown in FIG. 14 together with bit line interconnections and an interconnection layer located at the same level as that of the bit line interconnections.

FIG. 15 shows the layout shown in FIG. 14 together with bit line interconnections and an interconnection layer located at the same level as that of the bit line interconnections.

An interconnection 81 connects together a drain contact 66 of the transistor T7, constituting a P channel sense amplifier drive circuit, and the source contact 36 common to the transistors T3 and T4, constituting P channel sense amplifiers. The interconnection 81 connects to a contact 62 connected to the N type well area including P channel sense amplifiers. The interconnection 81 is formed of, for example, tungsten (W).

Further, an interconnection 82 connects together the drain contact 69 of the transistor T5, constituting an N channel sense amplifier drive circuit, and the source contact 47 common to the transistors T1 and T2, constituting N channel sense amplifiers. The interconnections 81 and 82 are alternately arranged in a column direction as shown in FIG. 15. In addition, some of the source contacts 36 and 47 do not have any direct connections in the same interconnection layer as that of the bit lines. However, the source contacts 36 are further connected together via an interconnection layer located above the interconnections 81 and 82, and the source contacts 47 are further connected together via an interconnection layer located above the interconnections 81 and 82.

Further, an interconnection 83, the bit line bBL, connects the drain contact 35 of the transistor T4, the gate electrode 32 of the transistor T3, the drain contact 46 of the transistor T2, and the gate electrode 43 of the transistor T1 together. An interconnection 84, the bit line BL, connects the drain contact 34 of the transistor T3, the gate electrode 33 of the transistor T4, the drain contact 45 of the transistor T1, and the gate electrode 44 of the transistor T2 together.

Figure 16:
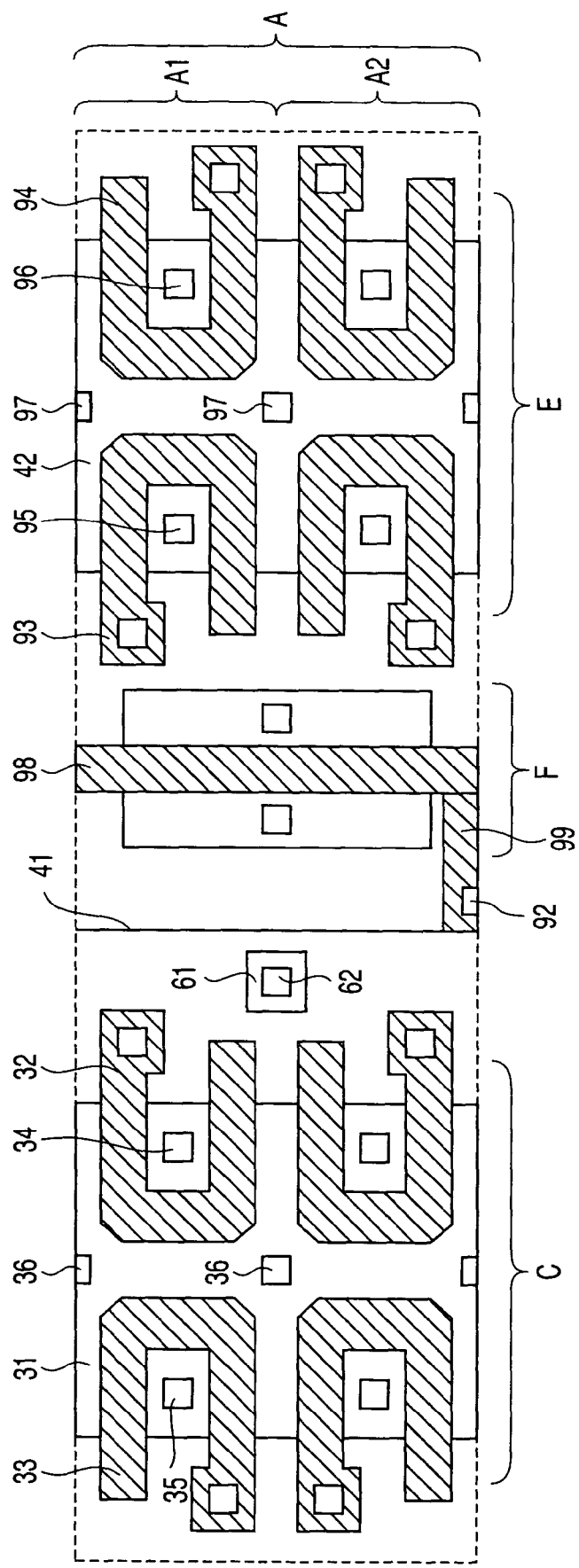
FIG. 16 is a diagram showing a layout of a second example of transistors constituting sense amplifiers and sense amplifier drive circuits in the semiconductor integrated circuit according to the above embodiment.

FIG. 16 is a diagram showing a layout of a second example of transistors constituting the sense amplifiers and the sense amplifier driving circuit.

FIG. 16 shows the sense amplifiers and sense amplifier driving circuit for two columns as in the case with the first example. A P channel sense amplifier (transistors T3 and T4) is arranged in an area C. An N channel sense amplifier (transistors T1 and T2) is arranged in an area E. A sense amplifier driving circuit (transistor T5) driving the N channel sense amplifier or a sense amplifier driving circuit (transistor T7) driving the P channel sense amplifier is arranged in an area F. Areas A1 and A2 show sense amplifier areas for the respective columns.

The arrangements in the layout diagram will described below in detail. Gate electrodes 32 and 33, drain contacts 34 and 35, and a common source contact 36 are formed on a P type diffusion area 31 as in the case with the first example. An N type diffusion area 61 and a contact 62 are used to set a potential in an N type well area including the P channel sense amplifier. Further, a well boundary 41 is arranged between the N type well area including the P channel sense amplifier and a P type well area including the N channel sense amplifier.

Gate electrodes 93 and 94, drain contacts 95 and 96, and a common source contact 97 are formed on an N type diffusion area 42 in the P type well area. The gate electrodes 93 and 94 belong to the cross coupled N channel transistors T1 and T2. The drain contacts 95 and 96 are connected to drains of the transistors T1 and T2, respectively. The common source contact 97 is connected to a common source of the transistors T1 and T2.

Further, the N channel MOS transistor T5 or T7, constituting the sense amplifier driving circuit, is formed in an area F in the P type well area. A gate electrode 98 is arranged in the area F. One end of the gate electrode 98 of the N channel MOS transistor T5 or T7 is not extended to the terminal of the area A but is cut. On the other end, an interconnect 99 is connected to the other end of the gate electrode 98 and connects to a contact 92.

Figure 17:
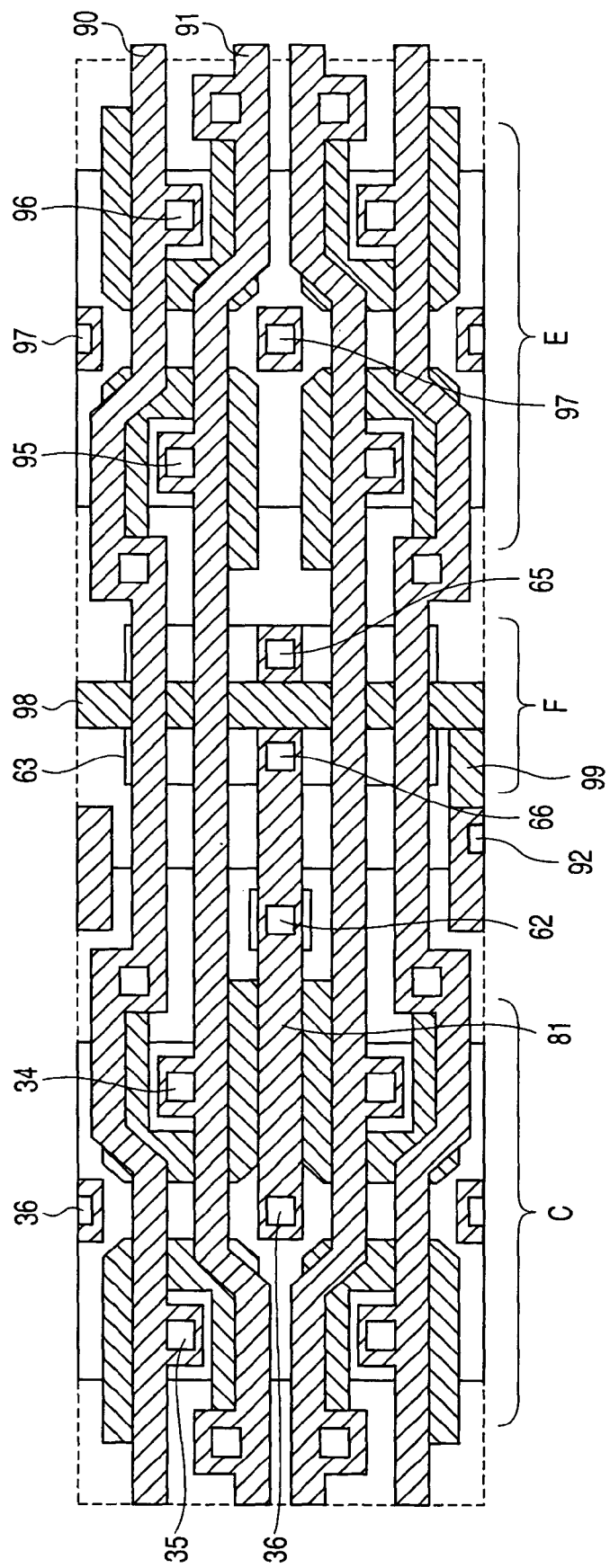
FIGS. 17 and 18 are diagrams showing the layout shown in FIG. 16 together with bit line interconnections and an interconnection layer located at the same level as that of the bit line interconnections.

FIG. 17 is a diagram of the layout shown in FIG. 16, additionally showing bit line interconnects and an interconnect layer in which the bit line interconnects are arranged. The N channel MOS transistor T7, which drives the P channel sense amplifier, is arranged in the area F.

The N channel MOS transistor T7, which drives the P channel sense amplifier, is formed on an N type diffusion area 63. A gate electrode 98, a source contact 65, and a drain contact 66 are arranged in the N type diffusion area 63.

An interconnect 81 is used to connect together the drain contact 66 of the N channel MOS transistor T7 and the common source contact 36 of the transistors T3 and T4, which constitute the P channel sense amplifier. The contact 62, connected to the N type well area including the P channel sense amplifier, is connected to the interconnect 81. The interconnect 81 is composed of, for example, tungsten (W). There are source contacts 36 and 97 not connected together directly in the same interconnect layer that contains the bit lines. However, an interconnect layer located above the interconnect 81 is used to connect the source contacts 36 together and the source contacts 97 together.

Further, an interconnect 90 that is a bit line bBL is used to connect the drain contact 35 of the transistor T4, the gate electrode 32 of the transistor T3, the gate electrode 93 of the transistor T1, and the drain contact 96 of the transistor T2 together. An interconnect 91 that is a bit line BL is used to connect the gate electrode 33 of the transistor T4, the drain contact 34 of the transistor T3, the drain contact 95 of the transistor T1, and the gate electrode 94 of the transistor T2 together.

The source contact 65 is connected to a source of the transistor T7. A voltage Vaa is supplied to the source contact 65. The drain contact 66 is connected to a drain of the transistor T7. A sense amplifier driving signal SAP is supplied to the drain contact 66.

Figure 18:
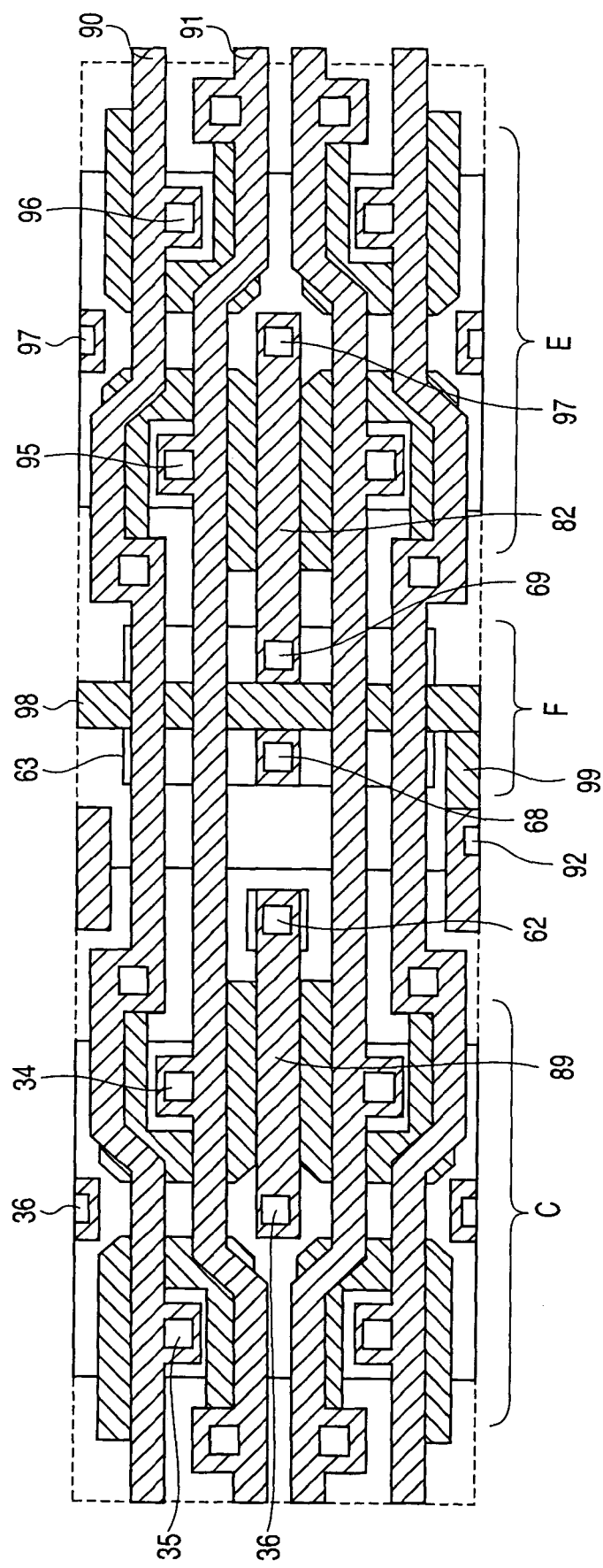

FIG. 18 is a diagram of the layout shown in FIG. 16, additionally showing bit line interconnects and an interconnect layer in which the bit line interconnects are arranged. This figure shows that the N channel MOS transistor T5, which drives the N channel sense amplifier, is arranged in the area F.

The N channel MOS transistor T5, which drives the N channel sense amplifier, is formed on the N type diffusion area 63. The gate electrode 98, a source contact 68, and a drain contact 69 are arranged in the N type diffusion area 63.

An interconnect 82 is used to connect together the drain contact 69 of the N channel MOS transistor T5 and the common source contact 97 of the transistors T1 and T2, which constitute the N channel sense amplifier. The interconnect 82 is composed of, for example, tungsten (W). Further, an interconnect 89 is used to connect together the common source contact 36 of the transistors T3 and T4, which constitute the P channel sense amplifier and the contact 62, connected to an N type well area containing the P channel sense amplifier. There are source contacts 36 and 97 not connected together directly in the same interconnect layer that contains the bit lines. However, an interconnect layer located above the interconnects 82 and 89 is used to connect the source contacts 36 together and the source contacts 97 together.

Further, the interconnect 90 that is the bit line bBL is used to connect the drain contact 35 of the transistor T4, the gate electrode 32 of the transistor T3, the gate electrode 93 of the transistor T1, and the drain contact 96 of the transistor T2 together. The interconnect 91 that is the bit line BL is used to connect the gate electrode 33 of the transistor T4, the drain contact 34 of the transistor T3, the drain contact 95 of the transistor T1, and the gate electrode 94 of the transistor T2 together.

The source contact 65 is connected to a source of the transistor T7. A voltage Vaa is supplied to the source contact 65. The drain contact 66 is connected to a drain of the transistor T7. A sense amplifier driving signal SAP is supplied to the drain contact 66.

In this case, as shown in the circuit diagram in FIG. 10, both the N channel sense amplifier and the P channel sense amplifier are driven by the N channel MOS transistor. Furthermore, a sense enable signal SEN is inputted to either the transistor T5 or T7. In such a circuit configuration, the transistor T5 or T7 may be arranged in a line in the area F, which is adjacent to the areas C and E, in which the sense amplifier 6 is formed.

Further, with the layouts shown in FIGS. 17 and 18, the sense amplifier driving circuit (transistor T7 or T5) can be connected to each of the P channel sense amplifier (transistors T3 and T4) and the N channel sense amplifier (transistors T1 and T2). By arranging a desired number of layouts shown in FIGS. 17 and 18, in a predetermined area on the semiconductor substrate, the ratio of a transistor size for the transistor T5 to a transistor size for the transistor T7 can be freely set. For example, if 4 m columns of memory cells are arranged as cell arrays, a total of m sense amplifiers (transistors T7 or T5) can be arranged in the areas F. When i layouts one of which is shown in FIG. 17 are arranged and j layouts one of which is shown in FIG. 18 are arranged, i+j=m (i and j each denote 1, 2, . . . , m−1). By adjusting the number of layouts one of which is shown in FIG. 17 and the number of layouts one of which is shown in FIG. 18, the transistor sizes of the transistors T7 and T5 (sense amplifier driving circuits) are set to optimum values. This facilitates an increase in the speed of bit line sense and an increase in the speed of bit line restore.

Figure 19:
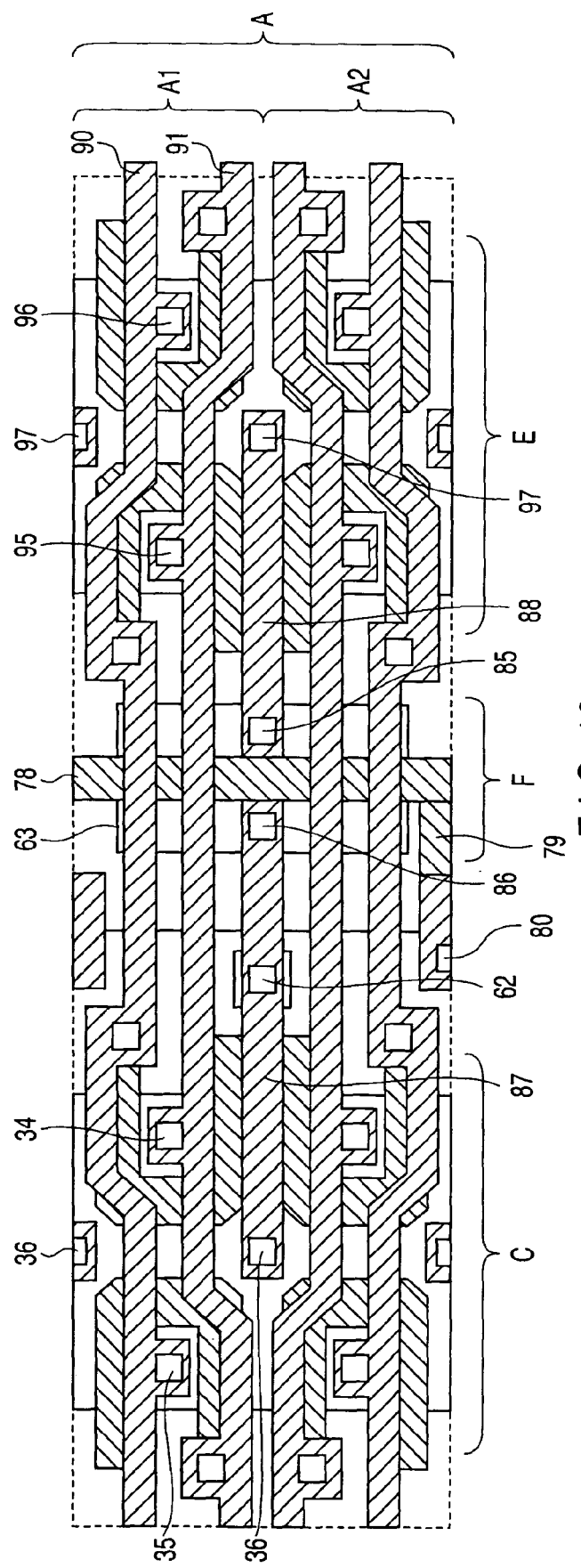
FIG. 19 is a diagram showing a layout in which a transistor T10 that equalizes the signal SAP with the signal SAN, the signals SAP and SAN being shown in FIG. 11, is arranged in the area F, shown in FIG. 16.

FIG. 19 is a diagram of a layout in which a transistor T10 that equalizes the signal SAP with the signal SAN, the signals SAP and SAN being shown in FIG. 11, is arranged in the area F, shown in FIG. 16.

The N channel MOS transistor T10, which equalizes the signal SAP with the signal SAN, is formed on the N type diffusion area 63. A gate electrode 78, a source contact 85, and a drain contact 86 are arranged in the N type diffusion area 63. One end of the gate electrode 78 of the N channel MOS transistor T10 is not extended to the terminal of the area A but is cut. On the other end, an interconnect 79 is connected to the other end of the gate electrode 98 and connects to a contact 80.

An interconnect 87 is used to connect together the drain contact 86 of the N channel MOS transistor T10 and the common source contact 36 of the transistors T3 and T4, which constitute the P channel sense amplifier. The contact 62, connected to the N type well area including the P channel sense amplifier, is connected to the interconnect 87. Further, an interconnect 88 is used to connect together the source contact 85 of the N channel MOS transistor T10 and the common source contact 97 of the transistors T1 and T2, which constitute the N channel sense amplifier. The interconnects 87 and 88 are composed of, for example, tungsten (W). There are source contacts 36 and 97 not connected together directly in the interconnect layer shown in FIG. 19. However, an interconnect layer located above the interconnects 87 and 88 is used to connect the source contacts 36 together and the source contacts 97 together.

The signal SAEQ, shown in FIG. 12, is inputted to the gate electrode 78 of the equalize transistor T10. By distributively arranging the equalize transistors T10 in the area F in the column direction, the function of equalizing the signal SAP with the signal SAN can be improved, with interconnect resistance reduced. This increases the speed of equalize operations. As a result, it is possible to reduce the cycle time (tRC) required for reads and writes in the semiconductor integrated circuit.

In the layout example shown in FIG. 9, the transistors T3, T4, and T6, constituting P channel sense amplifiers and a sense amplifier drive circuit, are formed in the same N type well area. Thus, the potential of the N type well area cannot be reduced down to the voltage Vaa or lower. Accordingly, in the layout example shown in FIG. 9, when the P channel sense amplifiers start operating, the transistors T3 and T4 have a source potential lower than the voltage Vaa. Consequently, the sense amplifier drive circuit (transistor T6) is subjected to a back bias. Thus, a threshold voltage Vth of the transistor T6 increases to lessen its driving force. As a result, an initial sense speed achieved by the P channel sense amplifiers may decrease.

On the other hand, in this embodiment, during an initial sense operation performed by the P channel sense amplifiers, the sense amplifier drive circuit is not subjected to any back biases. Thus, the threshold voltage Vth remains low. This increases the initial sense speed achieved by the P channel sense amplifiers.

As described above, in the embodiment of the present invention, the layout and the circuit are improved to reduce the chip area compared to the prior art even if the bit line sense amplifier activating circuits are arranged adjacent to the sense amplifiers. This helps provide an inexpensive DRAM that can be randomly accessed at high speed.

More specifically, in the above embodiment, an N channel MOS transistor is substituted for a first drive transistor conventionally composed of a P channel MOS transistor to drive P channel sense amplifiers. Furthermore, a common signal is input to both a gate of a second drive transistor that drives N channel sense amplifiers and a gate of the first drive transistor. This enables the first and second drive transistors, which must conventionally be arranged in two columns, to be arranged in one column. Consequently, a fast DRAM can be provided which has a substantially smaller chip area than conventional DRAMs. Further, a potential for an N type well area including P channel sense amplifiers is taken from an output from the second drive transistor, which drives the P channel sense amplifiers. This increases the initial sense speed compared to the prior art.

As described above, according to the embodiment of the present invention, a semiconductor integrated circuit can be provided which is suitable for increasing the speed of an operation of sensing the bit line potential.

Further, the present invention is not limited to the previously described embodiment. However, various embodiments can be formed by altering the above configuration or adding various arrangements to the above embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
a memory cell array having memory cells arranged in matrix form;
sense amplifiers which amplify a signal read out from the memory cells and which include N channel sense amplifiers each comprising an N channel MOS transistor and P channel sense amplifiers each comprising a P channel MOS transistor;
a first and second drive circuits each including an N channel MOS transistor which drives the N channel sense amplifiers or P channel sense amplifiers, respectively, included in the sense amplifiers, the first and second drive circuits being arranged adjacent to the sense amplifiers; and
a sense amplifier control circuit which supplies a common control signal to both gate electrodes of the N channel MOS transistors included in the first and second drive circuits,
wherein the P channel MOS transistors each constituting the P channel sense amplifier are formed on an N type well area, the N channel MOS transistors each constituting the N channel sense amplifier are formed on a P type well area located adjacent to the N type well area, and the N channel MOS transistors included in the first and second drive circuits are formed on the P type well area.

2. A semiconductor integrated circuit according to claim 1, further comprising a plurality of first circuit groups each including the sense amplifiers including the N channel sense amplifier and the P channel sense amplifier, and the first driving circuit driving the N channel sense amplifier, the semiconductor integrated circuit further comprising a plurality of second circuit groups including the sense amplifiers and the second driving circuit driving the N channel sense amplifier,
wherein a transistor size ratio of an N channel MOS transistor possessed by the first driving circuit and an N channel MOS transistor possessed by the second driving circuit is set by changing the numbers of first and second circuit groups arranged to change the numbers of first and second driving circuits.

3. A semiconductor integrated circuit comprising:
a memory cell array having memory cells arranged in matrix form in a row and column directions, the memory cell array being connected to a pair of bit lines;
sense amplifiers which amplify a minor signal read out from the memory cell and appearing between the pair of bit lines, the sense amplifiers each including a P channel sense amplifier comprising a P channel MOS transistor, the sense amplifiers being successively arranged in the column direction;
drive circuits each comprising an N channel MOS transistor which drives the P channel sense amplifiers included in the sense amplifiers, the drive circuits being successively arranged adjacent to the sense amplifiers in the column direction; and
a sense amplifier control circuit which supplies a control signal to a gate electrode of the N channel MOS transistor included in each of the drive circuit,
wherein the P channel MOS transistors each constituting the P channel sense amplifier are formed on an N type well area, and a well potential of the N type well area is equal to a drain voltage of the N channel MOS transistor included in each of the drive circuits driving the P channel sense amplifiers.

4. A semiconductor integrated circuit according to claim 3, the N channel MOS transistors included in the drive circuits are formed on the a P type well area located adjacent to the N type well area.

5. A semiconductor integrated circuit comprising:
a memory cell array having memory cells arranged in matrix form in a row and column directions, the memory cell array being connected to a pair of bit lines;
sense amplifiers which amplify a minor signal read out from the memory cells and appearing between the pair of bit lines, the sense amplifiers including N channel sense amplifiers each comprising an N channel MOS transistor and P channel sense amplifiers each comprising a P channel MOS transistor, the sense amplifiers being successively arranged in the column direction;
a first and second drive circuits each including an N channel MOS transistor which drives the N channel sense amplifiers or P channel sense amplifiers, respectively, included in the sense amplifiers, the first and second drive circuits being successively arranged adjacent to the sense amplifiers in the column direction; and
a sense amplifier control circuit which supplies a common control signal to both gate electrodes of the N channel MOS transistors included in the first and second drive circuits,
wherein the P channel MOS transistors each constituting the P channel sense amplifier are formed on an N type well area, the N channel MOS transistors each constituting the N channel sense amplifier are formed on a P type well area located adjacent to the N type well area, and the N channel MOS transistors included in the first and second drive circuits are formed on the P type well area.

6. A semiconductor integrated circuit according to claim 5, wherein the N channel MOS transistor included in the first drive circuit driving the N channel sense amplifiers and the N channel MOS transistor included in the second drive circuit driving the P channel sense amplifiers are arranged in line in the column directions, and
a gate length of the N channel MOS transistor included in the first drive circuit is equal to a gate length of the N channel MOS transistor included in the second drive circuit.

7. A semiconductor integrated circuit according to claim 5, wherein the N channel MOS transistor included in the first drive circuit driving the N channel sense amplifiers and the N channel MOS transistor included in the second drive circuit driving the P channel sense amplifiers are arranged in line in the column directions, and
a threshold voltage of the N channel MOS transistor included in the first drive circuit is equal to a threshold voltage of the N channel MOS transistor included in the second drive circuit.

8. A semiconductor integrated circuit according to claim 5, wherein the N channel MOS transistor included in the first drive circuit driving the N channel sense amplifiers and the N channel MOS transistor included in the second drive circuit driving the P channel sense amplifiers are arranged in line in the column directions, and
the N channel MOS transistors included in the first and second drive circuits, respectively, have a common gate electrode extending in column direction.

9. A semiconductor integrated circuit according to claim 8, wherein source contacts connected to sources of the N channel MOS transistors included in the first and second drive circuits, respectively, are arranged opposite each other relative to the common gate electrode extending in the column direction.

10. A semiconductor integrated circuit according to claim 5, wherein a well potential of the N type well area is equal to a drain voltage of the N channel MOS transistor included in the second drive circuit driving the P channel sense amplifiers.

11. A semiconductor integrated circuit according to claim 5, further comprising a plurality of first circuit groups each including the sense amplifiers including the N channel sense amplifiers and the P channel sense amplifiers, and the first driving circuit driving the N channel sense amplifiers, the semiconductor integrated circuit further comprising a plurality of second circuit groups each including the sense amplifiers and the second driving circuit driving the N channel sense amplifiers, wherein a transistor size ratio of an N channel MOS transistor possessed by the first driving circuit and an N channel MOS transistor possessed by the second driving circuit is set by changing the numbers of first and second circuit groups arranged to change the numbers of first and second driving circuits.

* * * * *